United States Patent [19]

Boatwright

[11] Patent Number: 4,669,098
[45] Date of Patent: May 26, 1987

[54] INCREASED RESOLUTION COUNTING CIRCUIT

[75] Inventor: John P. Boatwright, Aloha, Oreg.

[73] Assignee: Tektronix, Inc., Beaverton, Oreg.

[21] Appl. No.: 864,042

[22] Filed: May 16, 1986

[51] Int. Cl.⁴ .............................................. G06M 3/12
[52] U.S. Cl. ........................................ 377/28; 307/234
[58] Field of Search ....................... 377/27, 28, 30, 24, 377/29; 371/47, 6, 55, 30; 307/234, 518, 527, 528; 328/63, 72, 110

[56] References Cited

U.S. PATENT DOCUMENTS 4,554,674  11/1985  Sakai et al. ............................ 377/24
4,600,845  7/1986  McKenna, Jr. ........................ 328/63

Primary Examiner—Stanley D. Miller
Assistant Examiner—Karl Ohralik
Attorney, Agent, or Firm—Mark L. Becker; George T. Noe

[57] ABSTRACT

A counting circuit includes a digital counter for counting the pulses of an input signal during a counting interval and a pair of digital latches for latching the binary state of the input signal at the beginning and end of the counting interval, respectively. The latched binary states of the input signal and the pulse count of the digital counter are evaluated by an interpreter such as logic circuitry or a microprocessor. The interpreter resolves the pulse count into half clock cycles by comparing the binary states and in response adjusts the pulse count by the addition or subtraction of half a clock cycle.

12 Claims, 6 Drawing Figures

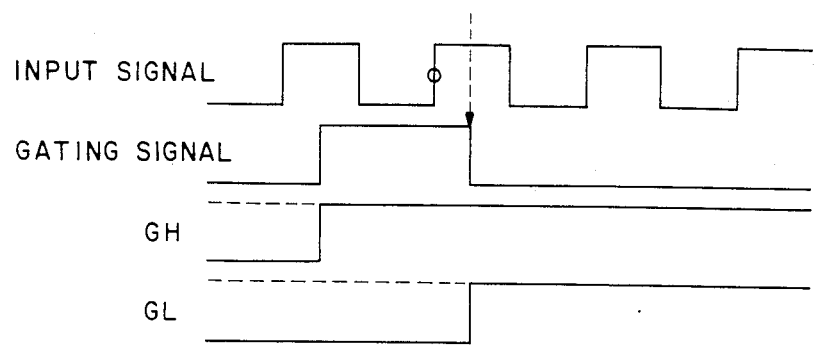
FIG. 2C
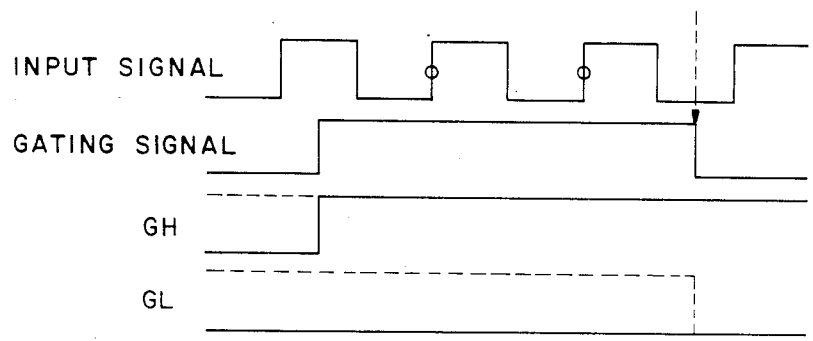
FIG. 2D
| FIG. | DATA$_1$ | GH | GL | COR-RECTION | 1/2 CLOCK CYCLES | DATA$_2$ PULSE COUNT |
|---|---|---|---|---|---|---|
| 2A | 1 | 0 | 0 | 0.0 | 2 | 1.0 |
| 2B | 3 | 0 | 1 | -0.5 | 5 | 2.5 |
| 2C | 1 | 1 | 1 | 0.0 | 2 | 1.0 |
| 2D | 2 | 1 | 0 | +0.5 | 5 | 2.5 |
FIG. 3

INCREASED RESOLUTION COUNTING CIRCUIT

FIELD OF THE INVENTION

This invention relates to digital counting circuitry and more particularly to a circuit that improves resolution of a digital counter in counting a binary input signal.

BACKGROUND OF THE INVENTION

Digital counter circuits, as the name implies, are used to count pulses of a binary input signal such as a clock signal. Typically, a counter circuit also receives an enabling or gating signal for enabling the counter to count during a predetermined interval. At the end of the counting interval, the counter is disabled and its cumulative count is latched to provide a count for the interval.

Counters can detect the count pulse from one of several events in an input signal. They may be sensitive either to the positive- or negative-going transition of the pulse edge or to the voltage level of the pulse. Both methods have a significant margin of error because they count each event as a complete clock cycle and do not resolve the cycle into only those portions present during the counting interval. For example, a positive transition edge-sensitive counter will count the same number of pulses regardless of whether the counting interval began before or after the negative-going transition of a pulse, because the negative-going transition is not detected by the counter. The interval is half a clock cycle longer in the first case than in the second case. It is desirable in many circumstances for the counter to resolve between portions of a clock cycle to provide a more accurate count, such as a fractional count of the cycles received during the interval.

Another drawback of counters that count only a single event in each clock cycle is the rate at which they count. The counter is limited by the frequency of the incoming signal.

One technique for increasing the resolution of digital counters is to utilize two independent counters in combination with a dual phase clock. Each counter receives a clock signal 180° out of phase from the other signal, effectively doubling the counting rate. The outputs of each counter are then combined via logic circuitry to provide the total count. The obvious drawback of this technique is the high cost and complexity of the necessary circuit.

SUMMARY OF THE INVENTION

An object of the invention, therefore, is to provide an improved circuit for more accurately counting a binary input signal.

Another object of the invention is to provide a circuit for improving the counting resolution of a digital counter.

Another object of the invention is to provide such a circuit that counts portions of a clock cycle.

Yet another object of the invention is to provide such a circuit that requires only a single counter circuit and a single clock signal as an input signal.

To achieve these objects, a circuit for counting a binary input signal includes a counter means for counting signal pulses during a counting interval and first and second means for latching the binary state of the input signal at the beginning and end of the counting interval, respectively. An interpreter means such as a microprocessor or digital circuitry then interprets the latched binary states of the input signal and in response generates a resolution signal that is combined with the pulse count to resolve the input signal count beyond the pulse count of the counter. The resultant number can represent either a count of half clock cycles or a pulse count with fractional resolution thereof, depending upon the desired designation.

In the embodiment described, the counter means may comprise a digital counter and each of the first and second means may comprise a digital latch such as a flip-flop. The counter means counts the pulses of an input signal during a counting interval determined by a gating signal. The digital latches then latch the binary state of the input signal at the beginning and at the end of the counting interval, respectively. The latched states are interpreted to further resolve the pulse count.

The foregoing and other objects, features, and advantages of the invention will become more apparent from the following detailed description of a preferred embodiment which proceeds with reference to the accompanying drawings.

BRIEF DESCRIPTION OF THE DRAWINGS

FIG. 2A through 2D are timing diagrams of signals within the resolution circuit.

FIG. 3 is a table showing the binary count and the increased resolution of the pulse count provided by the circuit of the invention.

DETAILED DESCRIPTION

Figure 1:
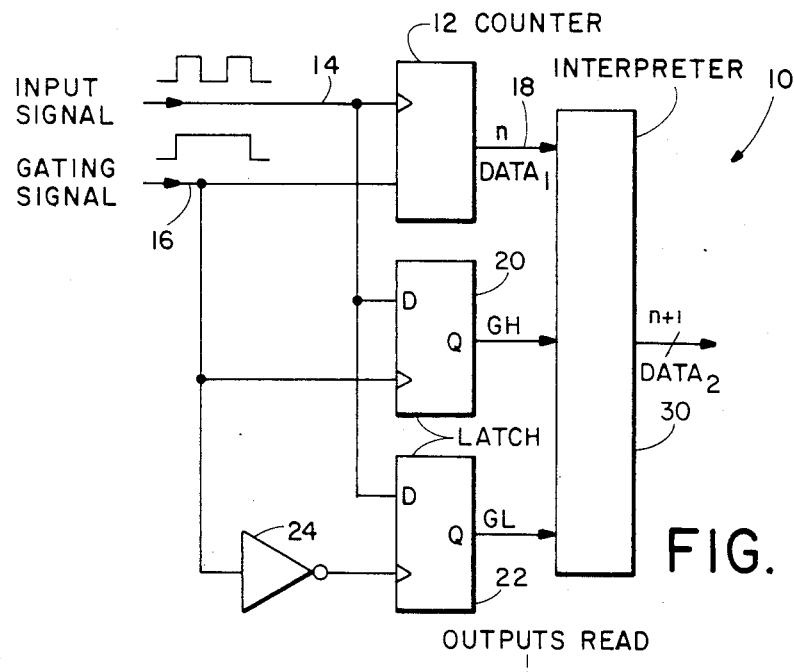
FIG. 1 is a block diagram of a resolution circuit according to the invention.

FIG. 1 shows a circuit 10 according to the invention. The invention includes a counter means such as a digital counter 12 for counting the pulses of an input signal such as a clock signal received along a path 14. The counter also receives a gating signal along a path 16 to enable the counter. The digital counter is of conventional design. In this embodiment, the counter is of a type that counts on the positive-going transition of the signal pulse. The gating signal enables the counter to count input pulses during a predetermined counting interval. At the end of the counting interval, the counter 12 latches a cumulative count which appears as an n-bit output on path 18, indicated as Data$_1$.

The input signal and gating signal are also routed to first and second means for latching the binary state of the input signal such as digital latches 20 and 22. The input signal forms the data input D for each latch 20, 22 and the gating signal forms a clocking input for each latch. The latch 20 is clocked by the positive-going transition of the gating signal at the beginning of the counting interval. The latch 22 is clocked by the negative-going transition of the gating signal at the end of the counting interval, the gating signal being inverted by inverter 24 before arriving at the latch 22. When each latch is clocked, it latches and stores the binary state of the input signal detected at the time of its clocking signal and provides that binary state at its output Q.

The output signal GH of the latch 20, therefore, represents the binary state of the input signal at the beginning of the counting interval and the output signal GL of the latch 22 represents the binary state of the input signal at the end of the counting interval. These two signals GH and GL are routed along with Data$_1$ from counter 12 to a means, represented by block 30, for interpreting the signals GH and GL. The interpreter 30 may be digital logic circuitry that compares the states of the signals GH and GL or may be a microprocessor that employs software routines to accomplish the same purpose. In response to this comparison, the interpreter 30 adjusts the value of the pulse count $Data_1$ by adding or subtracting from the pulse count. $Data_2$, the output of the interpreter 30, can represent a total number of half clock cycles or number of pulses with fractional resolution. For counting half clock cycles, the interpreter 30 may double the count of the counter 12 and then add or subtract one count based on the values of the GH and GL signals. For a pulse count, that total of half clock cycles can then be divided by two.

Figure 2A:
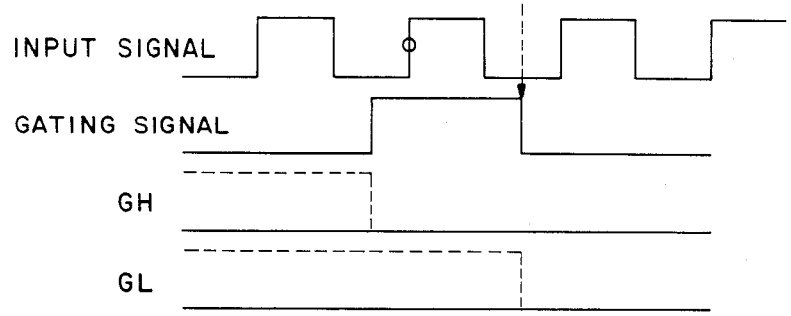

The operation of the circuit 10 in resolving a binary input signal into half clock cycles is best understood with reference to the timing diagrams in FIGS. 2A through 2D and the truth table of FIG. 3. Referring to FIG. 2A, the input signal to counter 12 is shown as a series of pulses. The gating signal pulse appears during the input signal to provide a counting interval of a length sufficient for only a single positive-going transition of the input signal pulse to be detected by the counter 12. Meanwhile, the latch 20 is clocked on the positive-going transition of the gating signal and latches the binary state of the signal at the beginning of the interval. In FIG. 2A, the binary state of the input signal is a logic 0 at the beginning of the interval and thus GH becomes a logic 0, the dashed lines indicating the previous state of GH could have been a logic 1. Latch 22, on the other hand, is clocked on the negative-going transition of the gating signal and thus latches the binary state of the input signal at the end of the counting interval, a logic 0. $Data_1$ from the counter 12 and the GH and GL signals are read by the interpreter 30 at the end of the counting interval, as indicated in the figure.

FIG. 3 shows the correction or improved resolution provided to the pulse count by the interpreter 30 in view of the logic states of signals GH and GL. With both signals a logic 0, the counting interval encompasses a whole number of clock cycles and the pulse count of the counter 12 is deemed accurate. No correction to $Data_1$ is required. $Data_2$ therefore has double the value of $Data_1$, if considered as half clock cycles or has the same value as $Data_1$, if considered a pulse count, but with increased resolution.

Figure 2B:
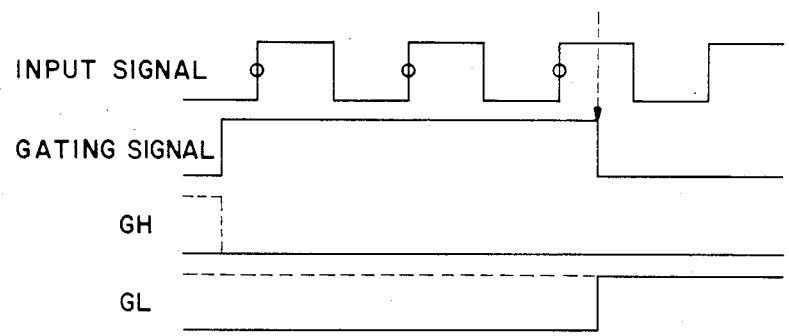

FIG. 2B illustrates the case where the counting interval encompasses a number of positive-going transitions counted as pulses by the counter 12 but less than that number of complete clock cycles, i.e., two and one-half clock cycles with three transitions. The binary state of the input signal is a logic 0 at the beginning of the counting interval and hence GH becomes a logic 0 upon the positive-going transition of the gating signal. GL, on the other hand, becomes a logic 1 upon the negative-going transition of the gating signal because the binary state of the input signal is logic 1 at the end of the counting interval. As shown in FIG. 3, with GH a logic 0 and GL a logic 1, the interpreter 30 subtracts half a clock cycle from the total of half cycles and from the count pulse. The result is a half clock cycle count of 5 or a pulse count of 2.5.

In FIG. 2C, the counter 12 detects a single pulse during the counting interval, which begins and ends during a logic 1 binary state of the input signal. Both GH and GL thus are logic 1 as a result. FIG. 3 indicates that in such a case the counting interval encompasses a whole number of clock cycles. No correction is necessary to the pulse count of $Data_1$ and the half clock cycles are double the number of pulses.

FIG. 2D illustrates the case where the pulse count fails to recognize a half cycle included in the counting interval. The counter 12 detects two positive-going transitions, but the counting interval encompasses two and one-half cycles. GH is logic 1 because the counting interval began during a logic 1 binary state of the input signal. GL is a logic 0 because the counting interval ended during a logic 0 binary state of the input signal. The relative states of GH and GL indicate that counting interval includes an undetected half clock cycle. The interpreter 30 in response adjusts the pulse count of counter 12 by adding the undetected half clock cycle, for a total pulse count of 2.5.

The circuit 10 thus increases the resolution of a counter 12 by counting half clock cycles rather than merely full cycles detected on the positive- or negative-going transitions or the voltage level of the input signal pulse. In effect, the circuit 10 doubles the resolution of a digital counter. Whether the value of $Data_2$ represents a total count of half clock cycles or a pulse count with fractional resolution depends only on the desired use of the information.

It is emphasized that the examples in FIGS. 2 and 3 are merely for illustration and do not limit the scope of the invention. The latch 22 could be of a type that is clocked on a negative-going transition, thus removing the need for the inverter 24. Or the counter 12 could be sensitive to the level of the input signal or to the negative-going transition of the pulse. In such cases, appropriate changes to the circuit 10 could be made by those skilled in the art in light of the description herein.

Having illustrated and described the principles of the invention in a preferred embodiment, it should be apparent to those skilled in the art that the invention can be modified in arrangement and detail, such as utilizing it in a single integrated circuit, without departing from such principles.

I claim all modifications coming within the spirit and scope of the following claims:

1. A counting circuit for counting a binary input signal, comprising:
    counter means for counting the input signal pulses during a counting interval and generating in response a pulse count;
    first means for latching the binary state of the input signal present at the beginning of the counting interval;
    second means for latching the binary state of the input signal at the end of the counting interval; and
    interpreter means in communication with the counter means and the first and second latching means for interpreting the binary state of the input signal at the beginning and end of the counting interval upon completion of the interval and adjusting the value of the pulse count to resolve the input signal beyond the pulse count of the counter means.

2. The circuit of claim 1 in which the first and second latching means each comprise a digital latch receiving the input signal as an input, one of the latches enabled to latch the binary state of the input signal at the beginning of the counting interval and the other of the latches enabled to latch the binary state of the input signal at the end of the counting interval.

3. The circuit of claim 2 in which the digital latch is edge sensitive.

4. The circuit of claim 2 in which the digital latch is level sensitive.

5. The circuit of claim 1 in which the counter means comprises a digital counter that receives a clock signal as the binary input signal and receives a gating signal to control the counting interval, the counter generating a count of the clock pulses received during the counting interval.

6. The circuit of claim 5 in which the first and second means each comprise a digital latch receiving the clock signal as input, one of the latches enabled by a first transition of the gating signal and the other latch enabled by a second transition of the gating signal.

7. The circuit of claim 6 in which the digital counter is edge sensitive.

8. The circuit of claim 6 in which the digital counter is level sensitive.

9. The circuit of claim 1 in which the interpreter means comprises digital logic circuitry for evaluating the binary states of the input signal at the beginning and end of the counting interval and adjusting the pulse count in response.

10. The circuit of claim 1 in which the interpreter means comprises a microprocessor for evaluating the binary states of the input signal and the beginning and end of the counting interval and adjusting the pulse count in response.

11. A circuit for resolving the pulse count of a binary input signal to a digital counter, comprising:
   first means for latching the binary state of the input signal to the counter at the beginning of a counting interval;
   second means for latching the binary state of the input signal to the counter at the end of the counting interval; and
   interpreter means in communication with the digital counter and the first and second latching means for interpreting the binary states of the input signal at the beginning and end of the counting interval and in response adjusting the pulse count to resolve the input signal beyond the pulse count of the counter.

12. A method of counting pulses of a binary input signal, comprising:
   counting the input signal pulses during a counting interval, each signal pulse counted on the occurrence of a predetermined transition condition;
   detecting the binary state of the input signal at the beginning of the counting interval;
   detecting the binary state of the input signal at the end of the counting interval; and
   adjusting the pulse count in response to the detected binary states to resolve the input signal beyond the pulse count.

* * * * *